(12) United States Patent
Sung et al.

(10) Patent No.: US 10,971,574 B2
(45) Date of Patent: *Apr. 6, 2021

(54) DISPLAY DEVICE

(71) Applicant: Samsung Display Co., Ltd., Yongin-si (KR)

(72) Inventors: Woo Yong Sung, Seoul (KR); Seung Ho Yoon, Hwaseong-si (KR); Won Woo Choi, Hwaseong-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/567,017

(22) Filed: Sep. 11, 2019

(65) Prior Publication Data

US 2020/0006462 A1    Jan. 2, 2020

Related U.S. Application Data

(63) Continuation of application No. 15/970,934, filed on May 4, 2018, now Pat. No. 10,453,912.

(30) Foreign Application Priority Data

Sep. 12, 2017 (KR) .................. 10-2017-0116836

(51) Int. Cl.
*H01L 27/32* (2006.01)
*H01L 51/52* (2006.01)

(52) U.S. Cl.
CPC ...... *H01L 27/3279* (2013.01); *H01L 27/3258* (2013.01); *H01L 51/5253* (2013.01)

(58) Field of Classification Search
CPC ............. H01L 27/3279; H01L 51/5253; H01L 27/3258

See application file for complete search history.

(56) References Cited

U.S. PATENT DOCUMENTS

| | | | |
|---|---|---|---|
| 7,605,599 B2 | 10/2009 | Kwak et al. | |
| 9,041,626 B2 | 5/2015 | Park et al. | |
| 10,453,912 B2* | 10/2019 | Sung | .................. H01L 27/3279 |
| 2016/0190503 A1 | 6/2016 | Chang et al. | |
| 2017/0069263 A1 | 3/2017 | Hu | |
| 2018/0033849 A1 | 2/2018 | Noh | .................... H01L 27/3272 |

FOREIGN PATENT DOCUMENTS

| | | |
|---|---|---|
| KR | 101398448 B1 | 5/2014 |
| KR | 1020140140414 A | 12/2014 |
| KR | 1020150094950 A | 8/2015 |

* cited by examiner

*Primary Examiner* — Jasmine J Clark
(74) *Attorney, Agent, or Firm* — Cantor Colburn LLP (57) ABSTRACT

A display device includes: a substrate including a display area at which an image is displayed with light, a non-display area which is adjacent to the display area, and a groove in the substrate, in the non-display area thereof; a light emitting element which generates and emits the light, disposed on the substrate in the display area thereof; and a common voltage transmitting line through which a common voltage is transmitted to the display area, disposed on the substrate in the non-display area thereof. The substrate further includes in each of the display area and non-display area thereof: a first insulating film, and a second insulating film disposed on the first insulating film. The groove extends into the second insulating film in a direction toward the first insulating film.

18 Claims, 8 Drawing Sheets

DISPLAY DEVICE

This application is a continuation application of U.S. application Ser. No. 15/970,934 filed May 4, 2018 and issued as U.S. Pat. No. 10,453,912 on Oct. 22, 2019, which claims priority to Korean Patent Application No. 10-2017-0116836 filed on Sep. 12, 2017, and all the benefits accruing therefrom under 35 U.S.C. § 119, the entire contents of which are incorporated herein by reference.

BACKGROUND

(a) Field

The present disclosure relates to a display device, and in detail, relates to a display device in which contact resistance of a common voltage transmitting line is reduced without extending a width of a periphery portion to which a common voltage is transmitted through the common voltage transmitting line.

(b) Description of the Related Art

A display device includes a liquid crystal display ("LCD"), a plasma display panel ("PDP"), an organic light emitting diode display ("OLED"), a field effect display ("FED"), an electrophoretic display, etc.

The organic light emitting diode display includes two electrodes and an organic emission layer interposed therebetween. Electrons injected from a cathode that is one of the two electrodes and holes injected from an anode that is the other of the two electrodes are bonded to each other in the organic emission layer to form excitons, and light is emitted while the excitons discharge energy.

In the organic light emitting diode display, each unit pixel includes switching elements such as a switching thin film transistor and a driving thin film transistor, a capacitor and an organic light emitting diode. A driving voltage is provided to the driving thin film transistor and the capacitor from a driving voltage line, and the driving thin film transistor serves to control an electrical current flowing to the organic light emitting diode through the driving voltage line. Also, a common voltage line connected to the common electrode as a cathode provides a common voltage to the cathode such that a potential difference is formed to the common electrode and the pixel electrode as an anode, such that electrical current flows.

The common voltage is transmitted to the common electrode through contact between the common electrode and a common voltage transmitting line of a contact area disposed at a periphery portion of the organic light emitting diode display.

SUMMARY

Exemplary embodiments provide a display device reducing the contact resistance of the common voltage transmitting line without extending the planar width of the non-display area around the display area of the display device.

A display device according to an exemplary embodiment includes: a substrate including a display area at which an image is displayed with light, a non-display area which is adjacent to the display area, and a groove in the substrate, in the non-display area thereof; a light emitting element which generates and emits the light, disposed on the substrate in the display area thereof; and a common voltage transmitting line through which a common voltage is transmitted to the display area, disposed on the substrate in the non-display area thereof. The substrate further includes in each of the display area and non-display area thereof: a first insulating film, and a second insulating film disposed on the first insulating film. The groove extends into the second insulating film in a direction toward the first insulating film.

The common voltage transmitting line may overlap the groove.

The light emitting element may include an electrode layer, and the electrode layer may be in contact with the common voltage transmitting line at a position overlapping the groove.

The groove of the substrate may extend only into the second insulating film.

The substrate may further include a first barrier film disposed between the first insulating film and the second insulating film, and the groove may penetrate the second insulating film and extend into the first barrier film.

The groove of the substrate may penetrate the second insulating film and may extend into the first insulating film.

The groove may be formed in plural.

A display device according to an exemplary embodiment includes: a substrate including a first insulating film; a second insulating film disposed on the first insulating film; and a groove extended into the second insulating film in a direction toward the first insulating film; a pixel at which an image is displayed; and a common voltage transmitting line through which a common voltage is transmitted to the pixel, disposed on the substrate. The common voltage transmitting line overlaps the groove formed in the substrate, and the common voltage transmitting line is connected to the pixel at a position overlapping the groove.

According to one or more of the exemplary embodiments, a surface contact area between the common voltage transmitting line and the common electrode may be increased without extending the width of the non-display area around the display unit of the display device, thereby reducing contact resistance of the common voltage transmitting line.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

The invention will be described more fully hereinafter with reference to the accompanying drawings, in which exemplary embodiments of the invention are shown. As those skilled in the art would realize, the described embodiments may be modified in various different ways, all without departing from the spirit or scope of the invention.

The drawings and description are to be regarded as illustrative in nature and not restrictive. Like reference numerals designate like elements throughout the specification.

Further, in the drawings, a size and thickness of each element are arbitrarily represented for better understanding and ease of description, and the present invention is not limited thereto. In the drawings, the thickness of layers, films, panels, regions, etc., are exaggerated for clarity. In the drawings, the thickness of layers, films, panels, regions, etc., are exaggerated for the convenience of description.

It will be understood that when an element such as a layer, film, region, or substrate is referred to as being related to another element such as being "on" another element, it can be directly on the other element or intervening elements may also be present. In contrast, when an element is referred to as being related to another element such as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

Further, in the specification, the word "on" or "above" means disposed on or below the object portion, and does not necessarily mean disposed on the upper side of the object portion based on a gravitational direction.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. In addition, unless explicitly described to the contrary, the word "comprise" and variations such as "comprises" or "comprising" will be understood to imply the inclusion of stated elements but not the exclusion of any other elements.

Further, throughout the specification, the phrase "on a plane" means viewing a target portion from the top, and the phrase "on a cross-section" means viewing a cross-section formed by vertically cutting a target portion from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

To uniformly transmit a common voltage to a display device, contact resistance of a common voltage transmitting line is minimized. For minimizing such contact resistance, a contact area between the common voltage transmitting line and the common electrode that are in contact with each other is formed to be relatively large.

As a demand for a bezel-less display device of which a non-display area around a display area is not recognized outside the display device has increased. For this purpose, forming a relatively narrow width of the periphery portion of the display area within the display device is desired. However, by forming the contact area between the common voltage transmitting line and the common electrode to be relatively large, it may be difficult to minimize a width of the periphery portion of the display area.

Figure 1:
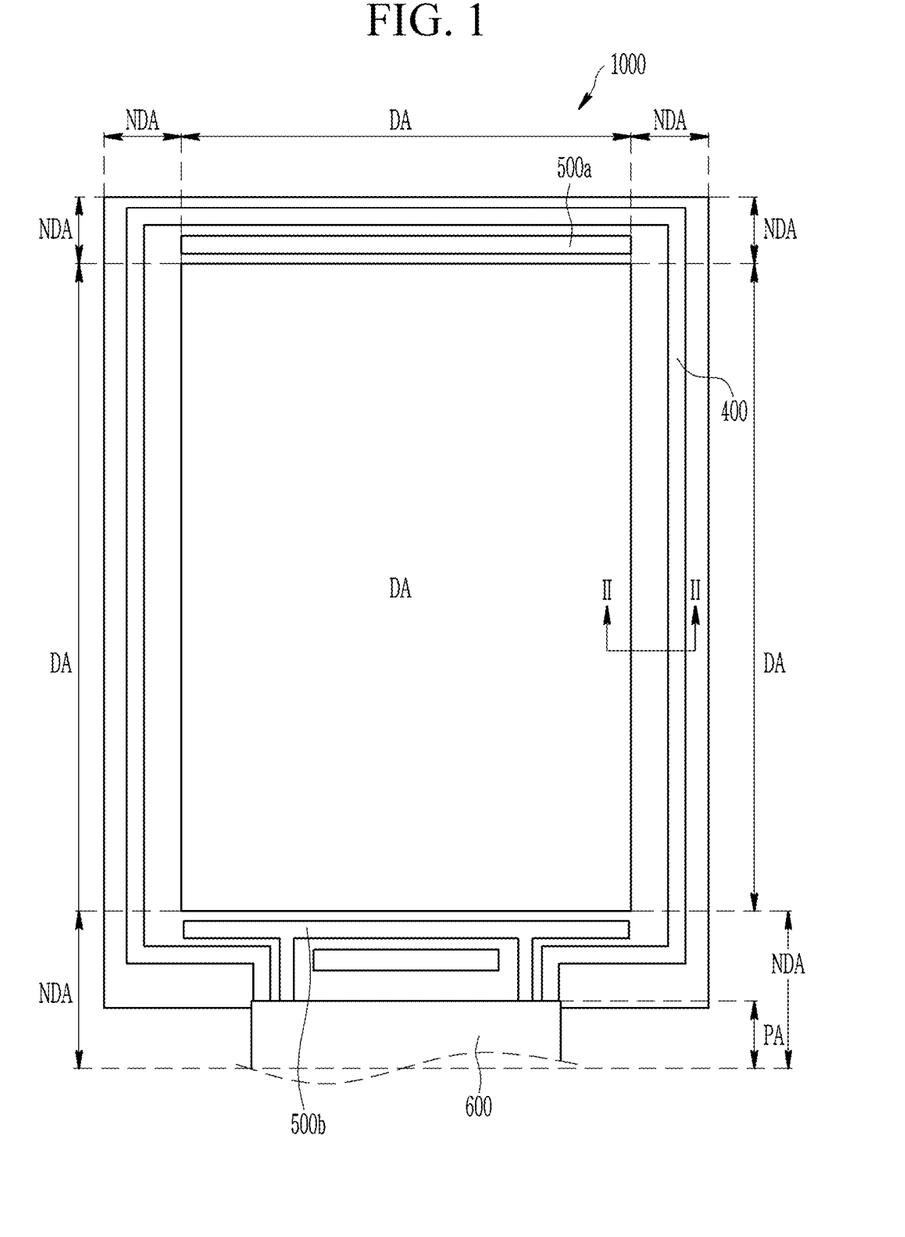
FIG. 1 is a top plan view of an exemplary embodiment of a display device according to the invention.
Figure 2:
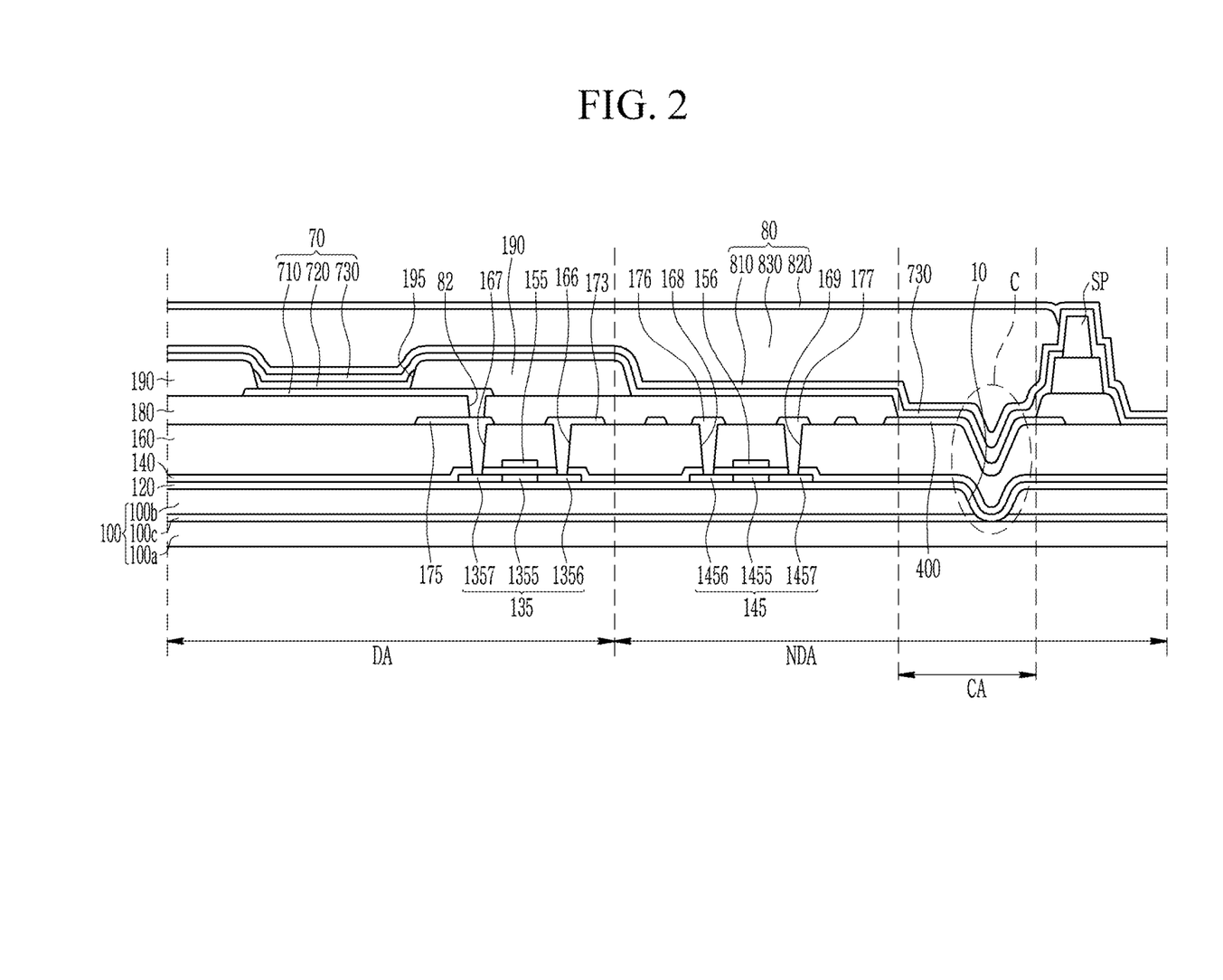
FIG. 2 is a schematic cross-sectional view taken along line II-II of FIG. 1.
Figure 3:
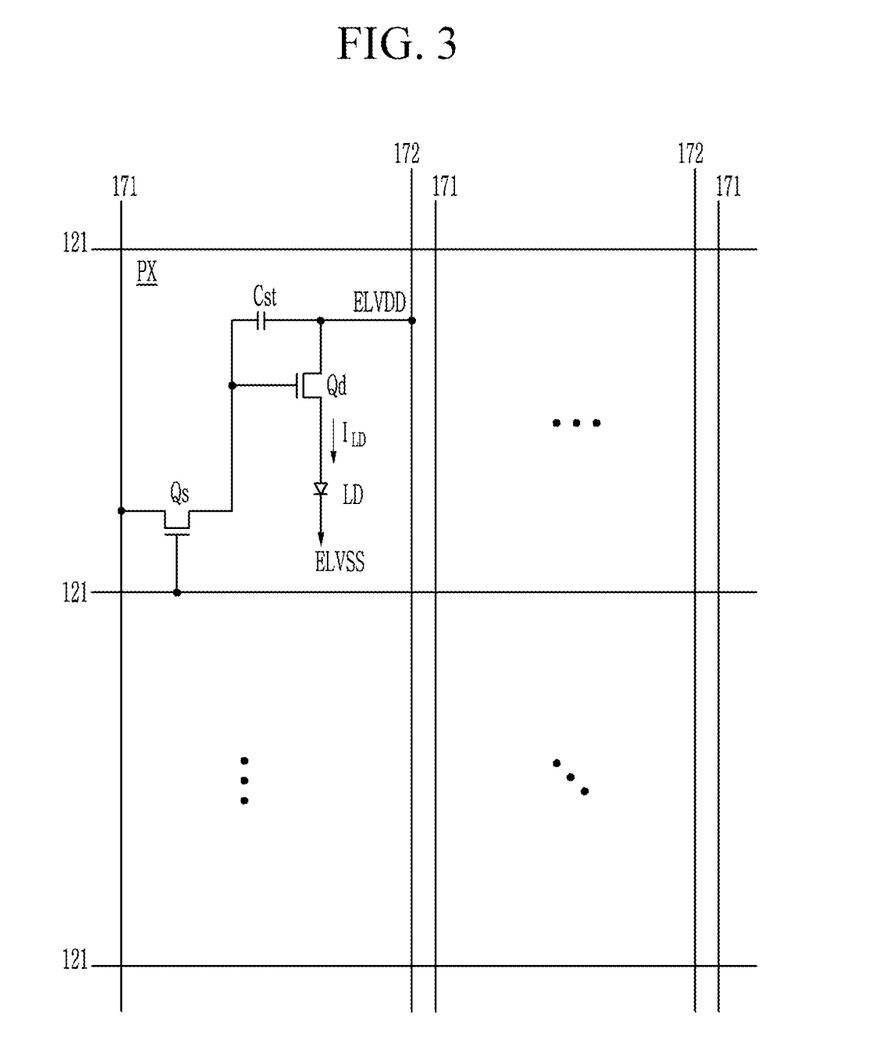
FIG. 3 is an equivalent circuit diagram of an exemplary embodiment of a pixel of a display device according to the invention.
Figure 4:
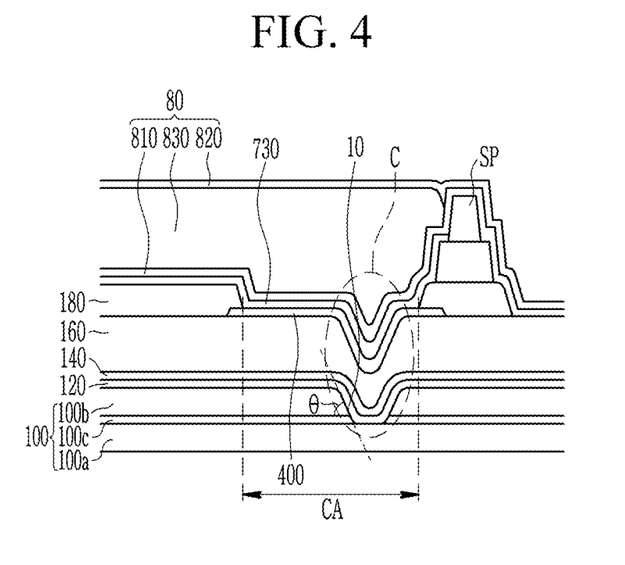
FIG. 4 is an enlarged cross-sectional view of an exemplary embodiment of a contact area of the display device of FIG. 2.

Now, a display device according to an exemplary embodiment will be described with reference to FIG. 1 to FIG. 4. FIG. 1 is a top plan view of an exemplary embodiment of a display device according to the invention, FIG. 2 is a schematic cross-sectional view taken along line II-II of FIG. 1, FIG. 3 is an equivalent circuit diagram of an exemplary embodiment of a pixel of a display device according to the invention, and FIG. 4 is an enlarged cross-sectional view of an exemplary embodiment of a contact area of the display device of FIG. 2.

Referring to FIG. 1, a display device 1000 according to one or more exemplary embodiment includes a display area DA at which an image is displayed with light and a non-display area NDA disposed outside the display area DA and at which the image is not displayed. The image may also be generated at the display area DA, by components of the display device 1000 which are disposed therein.

The non-display area NDA includes a driving area PA in which a driver 600 from and/or through which a signal is transmitted to the display area DA to drive the display area DA and displayed an image. The signal may be an electrical signal such as a driving signal, a control signal, a power signal, etc.

In the non-display area NDA, a common voltage transmitting line 400 through which a common voltage is transmitted and driving voltage transmitting lines 500a and 500b through which a driving voltage is transmitted are disposed.

In the exemplary embodiment, the common voltage transmitting line 400 starts from the driver 600 and encloses the display area DA along with a portion of the non-display area NDA. The driving voltage transmitting lines 500a and 500b include two portions separated from each other via the display area DA. The arrangement of the common voltage transmitting line 400 and the driving voltage transmitting lines 500a and 500b shown in FIG. 1 is one example, and the invention is not limited thereto.

The structure of the display area DA and the non-display area NDA will be described with reference to FIG. 2 to FIG. 4.

Referring to FIG. 3, the display area DA of the display device 1000 according to an exemplary embodiment includes a plurality of signal lines 121, 171 and 172 and a pixel PX connected to the signal lines 121, 171 and 172. The pixel PX may be provided in plurality and arranged in an approximate matrix. As used herein, the pixel PX means a minimum unit of displaying an image, and the display device 1000 displays an image by using a plurality of pixels PX. The image may also be generated at the pixel PX by components of the display device 1000 therein.

The signal lines include a gate line 121 provided in plurality for transmitting a gate signal (or a scan signal), a data line 171 provided in plurality for transmitting a data signal, and a driving voltage line 172 provided in plurality for transmitting a driving voltage ELVDD. The gate lines 121 are provided in a row direction and are substantially parallel with each other, such as having lengths thereof which are greater than widths thereof and extend in a first direction (e.g., horizontal in FIG. 3). The data lines 171 and the driving voltage lines 172 are provided in a column direction and are substantially parallel with each other such as having lengths thereof which are greater than widths thereof and extend in a second direction (e.g., vertical in FIG. 3) crossing the first direction.

The display device 1000 and components thereof may be disposed in a plane defined by the first and second directions which cross each other (e.g., horizontal and vertical in FIG. 1 and FIG. 3). A thickness of the display device and components thereof may extend along a third direction (e.g., vertical in FIG. 2 and FIG. 4) which crosses each of the first and second directions.

Each pixel PX includes one or more switching element such as a thin film transistor. Referring to FIG. 3, each pixel PX includes a switching thin film transistor Qs, a driving thin film transistor Qd, a storage capacitor Cst, and an organic light emitting diode ("OLED") LD as an organic light emitting element. Although not shown in the drawing, the pixel PX may further include another thin film transistor and another capacitor so as to compensate the electrical current supplied to the organic light emitting element.

The switching thin film transistor Qs has a control terminal, an input terminal and an output terminal. The control terminal of the switching thin film transistor Qs is connected to the gate line 121, the input terminal thereof is connected to the data line 171, and the output terminal thereof is connected to the driving thin film transistor Qd. Where a data signal is applied to the data line 171, the switching thin film transistor Qs transmits the data signal applied from the data line 171 to the driving thin film transistor Qd in response to the scanning signal applied to the gate line 121.

The driving thin film transistor Qd also has a control terminal, an input terminal and an output terminal. The control terminal of the driving thin film transistor Qd is connected to the switching thin film transistor Qs, the input terminal thereof is connected to the driving voltage line 172, and the output terminal thereof connected to the organic light emitting diode LD. The driving thin film transistor Qd differentiates magnitudes of the flow of electrical output (electrical) currents ILD depending upon the voltages (e.g., a difference in voltages) between the control and the output terminals thereof.

The storage capacitor Cst is connected between the control terminal and the input terminal of the driving thin film transistor Qd. The storage capacitor Cst is electrically charged with the data signals applied to the control terminal of the driving thin film transistor Qd, and stores such signals even after the switching thin film transistor Qs turns off.

The organic light emitting diode LD has an anode connected to the output terminal of the driving thin film transistor Qd and a cathode connected to a conductive line through and from which a common voltage ELVSS is transmitted. The organic light emitting diode LD changes intensity to generate and emit light depending on the output current ILD of the driving thin film transistor Qd to thus display the image with the light.

Now, an interlayer structure of the display device 1000 will be described with reference to FIG. 2.

As above-described, the display device 1000 includes the display area DA and the non-display area NDA. As shown in FIG. 2, the non-display area NDA includes a contact area CA.

The display device 1000 includes a (base) substrate 100 on which layers of the display device 1000 are disposed. The substrate 100 may be flexible and include a first insulating film 100a and a second insulating film 100b overlapping each other. The first insulating film 100a and the second insulating film 100b may each include polyimide. However, the first insulating film 100a and the second insulating film 100b are not limited thereto, and may include other materials that have heat resistance, chemical resistance and abrasion resistance, and are also flexible.

The substrate 100 further includes a first barrier film 100c disposed between the first insulating film 100a and the second insulating film 100b. The first barrier film 100c reduces or effectively prevents moisture and gas from being inflowed from outside the display device 1000 and through an area between the first insulating film 100a and the second insulating film 100b. Where the inflow of moisture and gas are minimized, deformation of the first insulating film 100a and the second insulating film 100b is reduced or effectively prevented.

As the substrate 100 includes the first insulating film 100a and the second insulating film 100b overlapping each other, even if damage is generated in the first insulating film 100a that is in contact with the outside, deterioration of the performance of the substrate 100 may be reduced or effectively prevented. In an exemplary embodiment of manufacturing a conventional display device, for example, a substrate 100 including the layers of the display device formed thereon is supported on a supporting substrate (not shown). The damage may be generated at an interface between the substrate 100 and the supporting substrate in a process of separating the substrate 100 of which the manufacturing process is completed from a supporting substrate supporting the substrate 100. However, in one or more exemplary embodiment according to the invention, as the substrate 100 of the display device 1000 includes the first insulating film 100a and the second insulating film 100b overlapping each other, even if the damage is generated at the first insulating film 100a closer to the supporting substrate than the second insulating film 100b, the second insulating film 100b remains without damage thereto, thereby increasing the reliability of the overall substrate 100.

A groove 10 is formed or defined in the substrate 100 at the contact area CA of the non-display area NDA. The groove 10 may be formed or defined in the second insulating film 100b and may extend in a thickness direction to at least a part of the first insulating film 100a. The groove 10 will be described in detail later.

A buffer layer 120 is disposed on the substrate 100. The buffer layer 120 may include a single layer of an insulating material layer such as a silicon nitride (SiNx) and a silicon oxide (SiOx), or a multilayer of insulating materials in which a silicon nitride (SiNx) and a silicon oxide (SiOx) are deposited. The buffer layer 120 reduces or effectively prevents penetration of an unnecessary component such as an impurity or moisture to components or layers of the display device which are disposed on the buffer layer 120.

Although not shown, a second barrier film (not shown) may be disposed between the second insulating film 100b and the buffer layer 120.

A first semiconductor layer 135 is disposed on the buffer layer 120 of the display area DA. The first semiconductor layer 135 may include a polysilicon or oxide semiconductor. In this case, the oxide semiconductor may include an oxide based on titanium (Ti), hafnium (Hf), zirconium (Zr), aluminum (Al), tantalum (Ta), germanium (Ge), zinc (Zn), gallium (Ga), tin (Sn), or indium (In), or complex oxides thereof.

The first semiconductor layer 135 includes a first channel region 1355, and a first source region 1356 and a first drain region 1357 disposed at respective sides of the first channel region 1355. The first channel region 1355 of the first semiconductor layer 135 may be a region in which an impurity is not doped, and the first source region 1356 and the first drain region 1357 of the first semiconductor layer 135 may be a region in which a conductive impurity is doped. Each of the regions may be formed from a same semiconductor material layer to which doping is applied at different levels.

Similarly, a second semiconductor layer 145 is disposed on the buffer layer 120 of the non-display area NDA. The second semiconductor layer 145 includes a second channel region 1455, and a second source region 1456 and a second drain region 1457 disposed at respective sides of the second channel region 1455. Each of the regions may be formed from a same semiconductor material layer to which doping is applied at different levels.

A gate insulating layer 140 is disposed on the first semiconductor layer 135 and the second semiconductor layer 145. The gate insulating layer 140 may be a single layer including tetraethyl orthosilicate ("TEOS"), a silicon oxide (SiOx), a silicon nitride (SiNx) or a silicon oxynitride (SiON), or a multilayer thereof.

A first gate electrode 155 and a second gate electrode 156 are disposed on the gate insulating layer 140. The first gate electrode 155 overlaps the first channel region 1355, and the second gate electrode 156 overlaps the second channel region 1455.

The first gate electrode 155 and the second gate electrode 156 may be a single layer or a multilayer, including a relatively low (electrical) resistance material such as aluminum (Al), titanium (Ti), molybdenum (Mo), copper (Cu), nickel (Ni), or alloys thereof, or a material having a relatively strong resistance against corrosion.

A first interlayer insulating layer 160 is disposed on the first gate electrode 155 and the second gate electrode 156. The first interlayer insulating layer 160 may be the single layer including tetraethyl orthosilicate ("TEOS"), a silicon oxide (SiOx), a silicon nitride (SiNx) or a silicon oxynitride (SiON), or a multilayer thereof.

The first interlayer insulating layer 160 and the gate insulating layer 140 have a first source contact hole 166 and a first drain contact hole 167 overlapping the first source region 1356 and the first drain region 1357, and a second source contact hole 168 and a second drain contact hole 169 overlapping the second source region 1456 and the second drain region 1457.

A first source electrode 173 and a first drain electrode 175, and a second source electrode 176 and a second drain electrode 177, are disposed on the first interlayer insulating layer 160. Also, a common voltage transmitting line 400 is disposed on the first interlayer insulating layer 160 of the contact area CA of the non-display area NDA.

The first source electrode 173 and the first drain electrode 175 are connected to the first source region 1356 and the first drain region 1357 of the first semiconductor layer 135 through the first source contact hole 166 and the first drain contact hole 167, respectively. Similarly, the second source electrode 176 and the second drain electrode 177 are connected to the second source region 1456 and the second drain region 1457 of the second semiconductor layer 145 through the second source contact hole 168 and the second drain contact hole 169, respectively.

The first source electrode 173 and the first drain electrode 175, and the second source electrode 176 and the second drain electrode 177, may be the single layer or the multilayer, including a relatively low (electrical) resistance material such as aluminum (Al), titanium (Ti), molybdenum (Mo), copper (Cu), nickel (Ni), or alloys thereof, or a material having relatively strong corrosion resistance. In an exemplary embodiment of manufacturing a display device, the common voltage transmitting line 400 may be simultaneously formed with the first source electrode 173, the first drain electrode 175, the second source electrode 176 and the second drain electrode 177. That is, these layers may be formed from a same material layer and/or in a same manufacturing process, such that these layers are disposed in a same layer of the display device among layers disposed on the substrate 100.

The first semiconductor layer 135, the first gate electrode 155, the first source electrode 173 and the first drain electrode 175 of the display area DA form a driving thin film transistor Qd of the pixel PX shown in FIG. 3. The second semiconductor layer 145, the second gate electrode 156, the second source electrode 176 and the second drain electrode 177 of the non-display area NDA form a thin film transistor included in a gate driver (not shown) disposed on the substrate 100 at the non-display area NDA thereof.

In FIG. 2, one transistor is respectively shown in each of the display area DA and the non-display area NDA, however this is for convenience of explanation, and the invention is not limited thereto.

As above-described, the groove 10 is formed in the substrate 100 disposed at the contact area CA of the non-display area NDA. Each of the plurality of insulating layers, the buffer layer 120, the gate insulating layer 140 and the first interlayer insulating layer 160 disposed on the substrate 100 has a recess portion C disposed or formed along the groove 10 of the substrate 100. Similarly, the common voltage transmitting line 400 disposed at the contact area CA also overlaps the groove 10 of the substrate 100, and accordingly the common voltage transmitting line 400 also has the recess portion C disposed or formed along the groove 10 of the substrate 100. As the common voltage transmitting line 400 has the recess portion C disposed or formed along the groove 10 of the substrate 100, a total surface area of the common voltage transmitting line 400 disposed at the contact area CA is increased.

Referring to FIG. 1, the common voltage transmitting line 400 collectively includes portions thereof lengthwise extending in extension directions. First portions of the common voltage transmitting line 400 lengthwise extend along the first direction (e.g., horizontal in FIG. 1) while widthwise extending along the second direction (e.g., vertical in FIG. 1). Second portions of the common voltage transmitting line 400 lengthwise extend in the second direction and widthwise extend in the first direction. That is, taking FIGS. 1 and 2 together, the groove 10 along which the common voltage transmitting line 400 is extended, may also include first and second portions corresponding to those of the common voltage transmitting line 400. In an exemplary embodiment, the first and second portions of the common voltage transmitting line 400 and of the groove 10 may be respectively connected to each other to form a single collective common voltage transmitting line 400 and a single collective groove 10 without being limited thereto.

A second interlayer insulating layer 180 is disposed or formed on the first source electrode 173, the first drain electrode 175, the second source electrode 176 and the second drain electrode 177. The second interlayer insulating layer 180 may be the single layer including tetraethyl orthosilicate ("TEOS"), a silicon oxide (SiOx), a silicon nitride (SiNx), or a silicon oxynitride (SiON), or a multilayer thereof like the first interlayer insulating layer 160.

The second interlayer insulating layer 180 has a contact hole 82 overlapping the first drain electrode 175. A portion of the material of the second interlayer insulating layer 180 is removed at a region overlapping the common voltage transmitting line 400 such that most of the common voltage transmitting line 400 does not overlap the second interlayer insulating layer 180 such that only the edge portion of the common voltage transmitting line 400 may overlap the second interlayer insulating layer 180. However, in another exemplary embodiment, the entire common voltage transmitting line 400 may not overlap the second interlayer insulating layer 180 such that an entire of the common voltage transmitting line 400 is exposed by the second interlayer insulating layer 180.

A pixel electrode 710 is disposed on the second interlayer insulating layer 180. The pixel electrode 710 may be an anode of an organic light emitting diode of FIG. 3. In the exemplary embodiment, the second interlayer insulating layer 180 is disposed between the pixel electrode 710 and the first drain electrode 175. However, where the pixel electrode 710 and the first drain electrode 175 are in a same layer as each other so as be integrated with each other, the second interlayer insulating layer 180 may be disposed on the same layer including both the pixel electrode 710 and the first drain electrode 175.

A partition (layer) 190 is disposed or formed on the pixel electrode 710. The partition 190 has an opening 195 overlapping the pixel electrode 710. The partition 190 may include a polyacrylate resin, a polyimide resin, a silica-based inorganic material, etc.

An organic emission layer 720 is disposed or formed in the opening 195 of the partition 190.

The organic emission layer 720 may include an emission layer and at least one of a hole injection layer ("HIL"), a hole transporting layer ("HTL"), an electron transporting layer ("ETL") and an electron injection layer ("EIL"). In the case where the organic emission layer 720 includes all these layers, the hole-injection layer is disposed on the pixel electrode 710 which is an anode, and the hole transporting layer, the emission layer, the electron transporting layer and the electron injection layer may be sequentially laminated thereon.

A common electrode 730 is disposed on the partition 190 and the organic emission layer 720. The common electrode 730 becomes a cathode of the organic light emitting diode. Accordingly, the pixel electrode 710, the organic emission layer 720 and the common electrode 730 form an organic light emitting diode 70.

The organic light emitting diode 70 may have any one structure of a top display type, a bottom display type and a dual-sided display type according to a direction in which the organic light emitting diode 70 emits light.

In the case of the front display type, the pixel electrode 710 includes or is formed of a reflective layer and the common electrode 730 includes or is formed of a transflective or transmissive layer. In contrast, in the case of the rear display type, the pixel electrode 710 includes or is formed of a transflective layer and the common electrode 730 includes or is formed of a reflective layer. In the case of the dual-sided display type, the pixel electrode 710 and the common electrode 730 include or are formed of a transparent layer or a transflective layer.

The reflective layer and the transflective layer described above may include or be made of at least one metal of magnesium (Mg), silver (Ag), gold (Au), calcium (Ca), lithium (Li), chromium (Cr), and aluminum (Al), or alloys thereof. The reflective layer and the transflective layer are determined by the thicknesses thereof, and the transflective layer may have a thickness of less than about 200 nanometers (nm). As the thickness of the layer is decreased, transmittance of light is increased, but when the thickness is relatively very small, the electrical resistance is increased. The transparent layer includes or is made of a material of indium tin oxide ("ITO"), indium zinc oxide ("IZO"), zinc oxide ("ZnO"), indium oxide (In2O3) or the like.

The common electrode 730 may be disposed on the entire surface of the substrate 100 including the display area DA and the non-display area NDA, and is in contact with the common voltage transmitting line 400 on the contact area CA of the non-display area NDA, thereby receiving the common voltage from the common voltage transmitting line 400.

As above-described, the substrate 100 has the groove 10 disposed at the contact area CA of the non-display area NDA, and the common voltage transmitting line 400 has the recess portion C extended along a profile of the groove 10 of the substrate 100. Similarly, the common electrode 730 contacted with the common voltage transmitting line 400 also has a recess portion C disposed in the contact area CA. In this way, the common voltage transmitting line 400 and the common electrode 730 that are in contact with each other in the contact area CA each have the recess portion C extended along the groove 10 formed in the substrate 100 such that a total contact area between the common voltage transmitting line 400 and the common electrode 730 is increased, thereby decreasing the contact resistance therebetween.

A planar area of an element of the display device may be defined by a product of two dimensions respectively taken in two directions which cross each other. Referring to FIG. 1 and FIG. 2 and considering a plane defined by the first and second directions described above, a planar area of the contact area CA of the substrate 100 may be defined by a product of a minimum length of the common voltage transmitting line 400 contacting the common electrode 730 and a minimum width of the common voltage transmitting line 400 contacting the common electrode 730.

Referring again to FIG. 1 and FIG. 2, an actual surface area of the common voltage transmitting line 400 contacting the common electrode 730 includes not only planar dimensions of these features in the first and second directions, but also includes dimensions along the third (thickness) direction. That is, since an actual surface area of the common voltage transmitting line 400 includes the recess portions C thereof disposed or formed along the groove 10 in a thickness direction of the substrate 100, a total actual surface area of the common voltage transmitting line 400 contacting the common electrode 730 may be larger than a total planar area of the contact area CA of the substrate 100 at which the common voltage transmitting line 400 contacts the common electrode 730. That is, the total contact area between the common voltage transmitting line 400 and the common electrode 730 is increased to be larger than the planar area of the contact area CA, thereby decreasing the contact resistance between the common voltage transmitting line 400 and the common electrode 730.

A spacer SP is located on an outer portion of the non-display area NDA. The spacer SP may be a multilayer element formed from portions of material layers disposed in the display area DA. In an exemplary embodiment, the spacer SP may include a first insulating layer portion including or made of the same (material) layer as the second interlayer insulating layer 180, a pixel definition layer (such as the partition 190) and an additional insulating layer.

An encapsulation layer 80 is disposed on the common electrode 730. The encapsulation layer 80 may be collectively formed by alternately depositing at least one inorganic layer and at least one organic layer. In an exemplary embodiment, a plurality of inorganic layers or a plurality of organic layers may be included in the encapsulation layer 80.

In the exemplary embodiment, the encapsulation layer 80 includes a first inorganic encapsulation layer 810 and a second inorganic encapsulation layer 820, and further includes an organic encapsulation layer 830 disposed between the first inorganic encapsulation layer 810 and the second inorganic encapsulation layer 820.

The first inorganic encapsulation layer 810 and the second inorganic encapsulation layer 820 are disposed or formed on the entire surface of the substrate 100 such that they are also disposed on the spacer SP. The organic encapsulation layer 830 is not disposed outside the spacer SP toward an edge of the substrate 100 among portions of the non-display area NDA.

In an exemplary embodiment of manufacturing a display device, when forming the organic encapsulation layer 830, the spacer SP serves as a dam to reduce or effectively prevent an organic material for forming the organic encapsulation layer 830 from overflowing. Since the organic material does not overflow the spacer SP and is not disposed further than the spacer SP, the organic encapsulation layer 830 may not be formed outside the spacer SP toward the edge of the substrate 100. In the exemplary embodiment, the substrate 100 has the groove 10 positioned at the contact area CA, and the organic material for forming the organic encapsulation layer 830 may be further efficiently reduced or effectively prevented from overflowing through a relatively large step formed by the recess portions C at the groove 10 near the spacer SP.

The structure of one pixel disposed in the display area DA of the display device is shown in FIG. 2 and FIG. 3, but the pixel structure of the display device according to an exemplary embodiment of the invention is not limited to the structure shown in FIG. 2 and FIG. 3. The signal line and the organic light emitting diode can be formed with various structures within a range which can be easily modified by technical experts. In an exemplary embodiment, for example, in FIG. 3, as the display device, one in which one pixel includes two thin film transistors (TFTs) and one capacitor is shown, but the invention is not limited thereto. Accordingly, the display device is not limited to the number of thin film transistors, the number of the capacitors and/or and the number of the wires.

As shown in FIG. 2 and FIG. 4, the substrate 100 of the display device according to the exemplary embodiment has the groove 10 disposed at the contact area CA of the non-display area NDA. The common voltage transmitting line 400 and the common electrode 730 that are in contact with each other at the contact area CA each has a recess portion C extended along the groove 10 of the substrate 100. Accordingly, a total contact area between the common voltage transmitting line 400 and the common electrode 730 is increased by being extended along a thickness direction without extending the width of the contact area CA in a planar direction, and the contact resistance therebetween decreases owing to the increased total contact area.

Referring to FIG. 4, the edge of the groove 10 of the substrate 100 is inclined with respect to the lower surface of the substrate 100 to form a first angle θ, and the groove 10 has a taper structure of which a cross-section gradually increases along a direction from the substrate 100 toward the thin film encapsulation layer 80. That is, a side portion of the substrate 100 at the groove 10 forms the first angle θ with a lower surface of the substrate 100. Accordingly, by the insulating layers extending along the first angle θ into the groove 10 in the thickness direction, the overlying common voltage transmitting line 400 and the common electrode 730 also extend along the first angle θ in the thickness direction such that disconnection thereof at the groove 10 may be reduced or effectively prevented.

Figure 5:
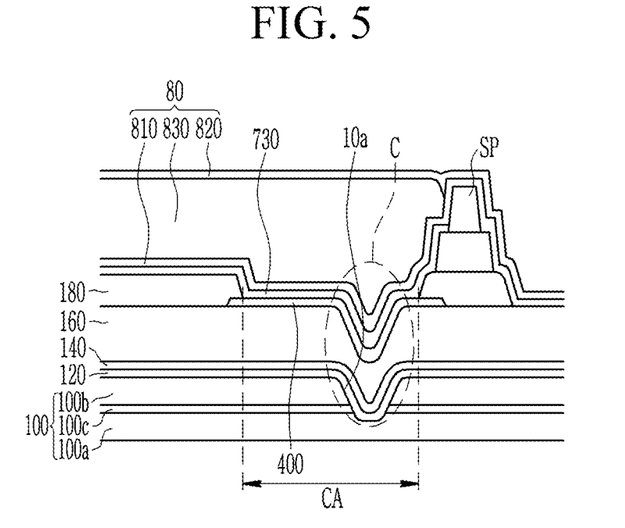
FIG. 5 is a cross-sectional view of another exemplary embodiment of a contact area of a display device according to the invention.

The contact area CA of the display device according to another exemplary embodiment will be described with reference to FIG. 5. FIG. 5 is a cross-sectional view of another exemplary embodiment of a contact area of a display device according to the invention.

Referring to FIG. 5, the contact area CA of the display device according to the present exemplary embodiment is similar to the contact area CA of the display device according to the exemplary embodiment described with reference to FIG. 4. The detailed description for the same constituent elements will be omitted.

The substrate 100 of the display device according to one or more exemplary embodiment has a first groove 10a defined or formed in the first insulating film 100a as well as the second insulating film 100b. The first groove 10a penetrates completely through the second insulating film 100b of the substrate 100 and extends into the first insulating film 100a. In this way, as the first groove 10a extends into a portion the first insulating film 100a, a total depth of the first groove 10a increases. Accordingly, the depth of the recess portion C of the common voltage transmitting line 400 and the common electrode 730 extended along the first groove 10a also deepens as compared to where a groove does not extend into the first insulating film 100a and terminates at the first barrier layer 100c. Therefore, a total contact area of the common voltage transmitting line 400 and the common electrode 730 may become larger as the total depth of the groove formed in the substrate 100 is increased.

Features of the display device according to the exemplary embodiment described with reference to FIG. 1 to FIG. 4 are applicable to the display device of FIG. 5.

Figure 6:
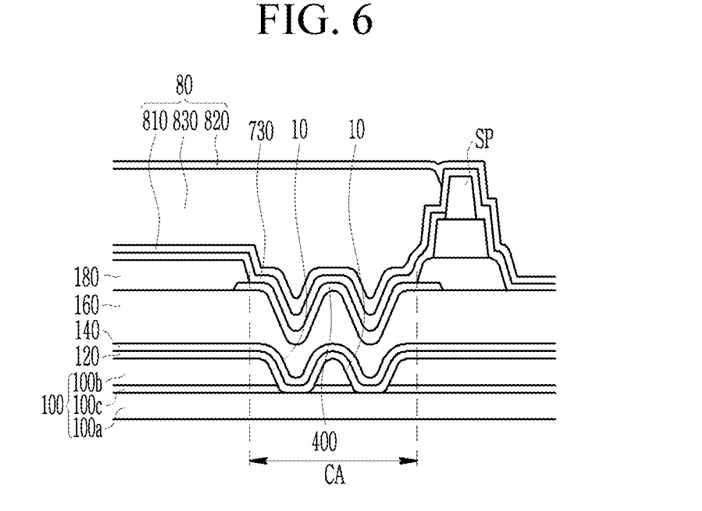
FIG. 6 is a cross-sectional view of still another exemplary embodiment of a contact area of a display device according to the invention.

The contact area CA of the display device according to still another exemplary embodiment will be described with reference to FIG. 6. FIG. 6 is a cross-sectional view of still another exemplary embodiment of a contact area of a display device according to the invention.

Referring to FIG. 6, the contact area CA of the display device according to the exemplary embodiment is similar to the contact area CA of the display device according to the exemplary embodiment described with reference to FIG. 4. The detailed description for the same constituent elements is omitted.

The substrate 100 of the display device according to the present exemplary embodiment has the groove 10 provided in plurality disposed at the contact area CA. In this way, as the substrate 100 has the plurality of grooves 10, a total cross-section of the recess portion C taken along the grooves 10 increases. Accordingly, a total contact area of the common voltage transmitting line 400 and the common electrode 730 that are in contact with each other in the contact area CA may further increase as the number of grooves increases at the contact area CA.

Features of the display devices according to the exemplary embodiment described with reference to FIG. 1 to FIG. 4 and the exemplary embodiment described with reference to FIG. 5 are applicable to the display device of FIG. 6.

The substrate 100 of the display device according to one or more of the above-described exemplary embodiments has the groove 10/10a disposed at the contact area CA, and the common voltage transmitting line 400 and the common electrode 730 that are in contact with each other at the contact area CA have the recess portion C extended along the groove 10/10a of the substrate 100. Accordingly, the contact area between the common voltage transmitting line 400 and the common electrode 730 is increased without increasing a planar width of the contact area CA, and the contact resistance decreases therebetween.

Figure 7:
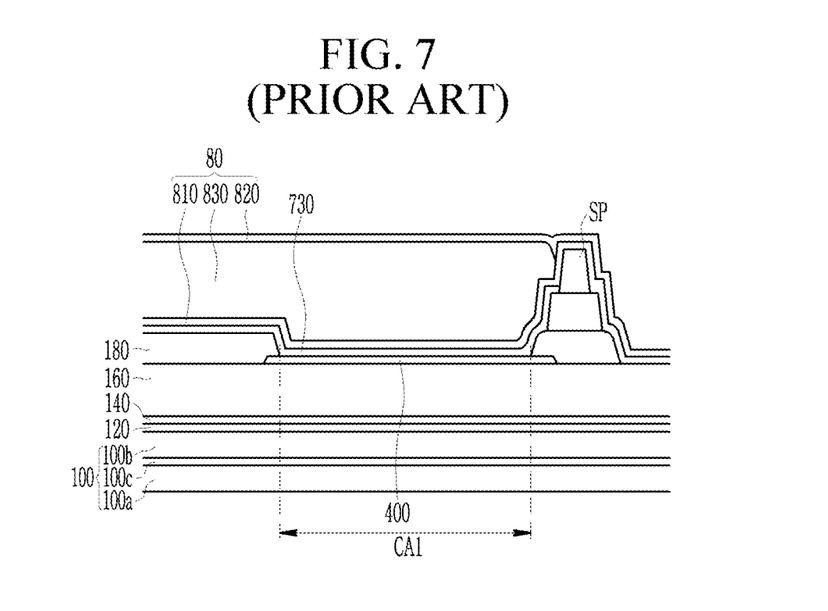
FIG. 7 is a cross-sectional view of a contact area of a display device according to a comparative example.

A comparative example will now be described with reference to FIG. 7. FIG. 7 is a cross-sectional view of a contact area of a display device according to a comparative example.

Referring to FIG. 7, the substrate 10 does not have the groove along which overlying layers extend to increase an area thereof. Accordingly the common voltage transmitting line 400 and the common electrode 730 disposed at the first contact area CA1 are extended substantially flat without the recess portion corresponding to the groove. Accordingly, the surfaces of the common voltage transmitting line 400 and the common electrode 730 that are in contact with each other at the first contact area CA1 are also substantially flat. Therefore, when the total contact area of the common voltage transmitting line 400 and the common electrode 730 connected with each other at the first contact area CA1 is the same as the total contact area of the common voltage transmitting line 400 and the common electrode 730 of the display devices according to the exemplary embodiments described with reference to FIG. 1 to FIG. 6, a total planar width of the first contact area CA1 is greater than a total planar width of the contact area CA of the display device according to the above-described exemplary embodiments.

Accordingly, while the width of the contact area CA of the display device according to one or more of the above-described exemplary embodiments is formed to be narrower than the width of the first contact area CA1 of the display device according to the comparative example, in both structures, the contact areas of the common voltage transmitting line 400 and the common electrode 730 may be maintained to be equal to each other.

In an exemplary embodiment of manufacturing a display device, the groove 10 of the substrate 100 disposed at the contact area CA of the display device according to one or more of the exemplary embodiments may be formed by using a laser. The groove of the substrate 100 may be formed before depositing a plurality of insulating layers on the substrate 100, or may be formed after depositing a plurality of insulating layers on the substrate 100.

Figure 8:
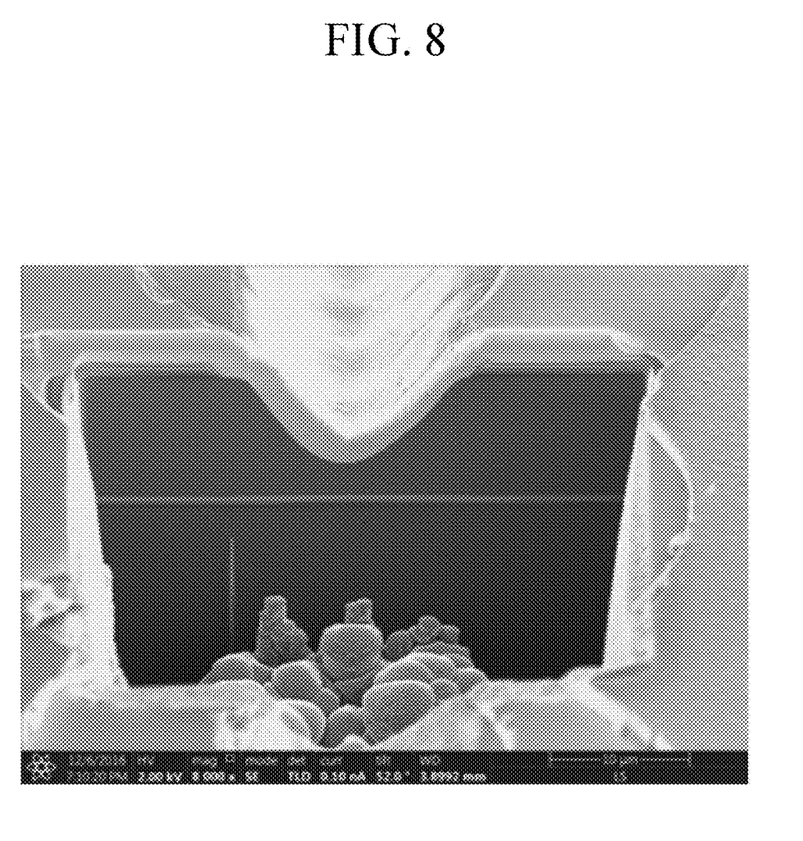
FIG. 8 and FIG. 9 are electron micrographs showing exemplary embodiments of a portion of a contact area of a display device according to experimental examples.
Figure 9:
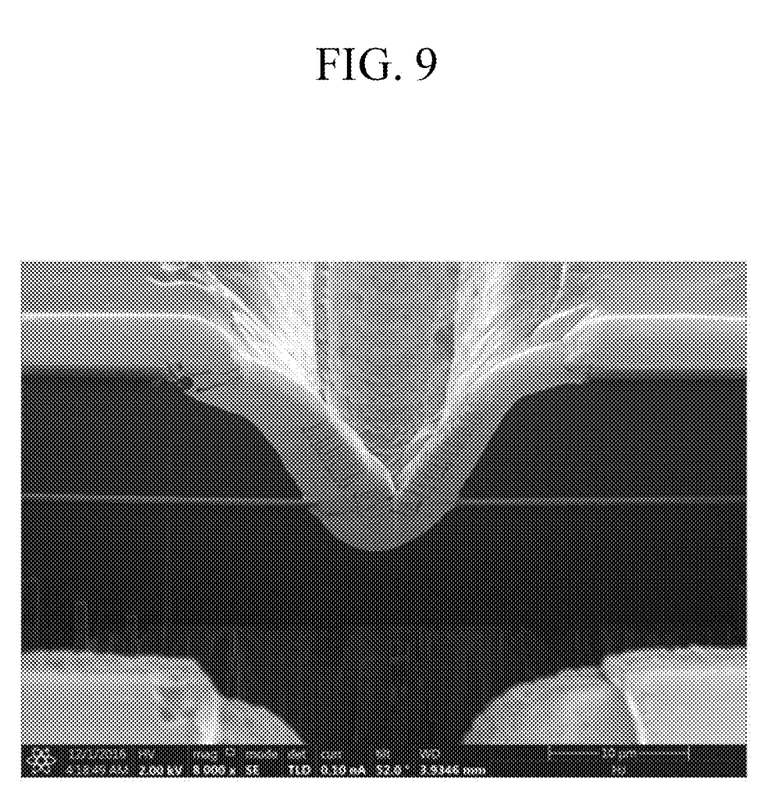

Experimental examples will be described with reference to FIG. 8 and FIG. 9. FIG. 8 and FIG. 9 are electron micrographs showing exemplary embodiments of a contact area of a display device according to experimental examples.

The groove is formed in the substrate by using the laser in the experimental example. FIG. 8 shows a case that the groove is only formed in the second insulating film 100b disposed relatively higher among the first insulating film 100a and the second insulating film 100b relative to the substrate 100. FIG. 9 shows a case that the groove is also formed at the portion of the first barrier film 100c and the first insulating film 100a each disposed under the second insulating film 100b as well as in the second insulating film 100b of the substrate 100.

Referring to FIG. 8 and FIG. 9, it may be confirmed that the groove may be formed in the substrate 100 by using the laser. Additionally, the groove formed by using the laser in each of FIG. 8 and FIG. 9 may be formed to have the tapered structure without disconnection of the overlaying layer thereof.

Figure 10:
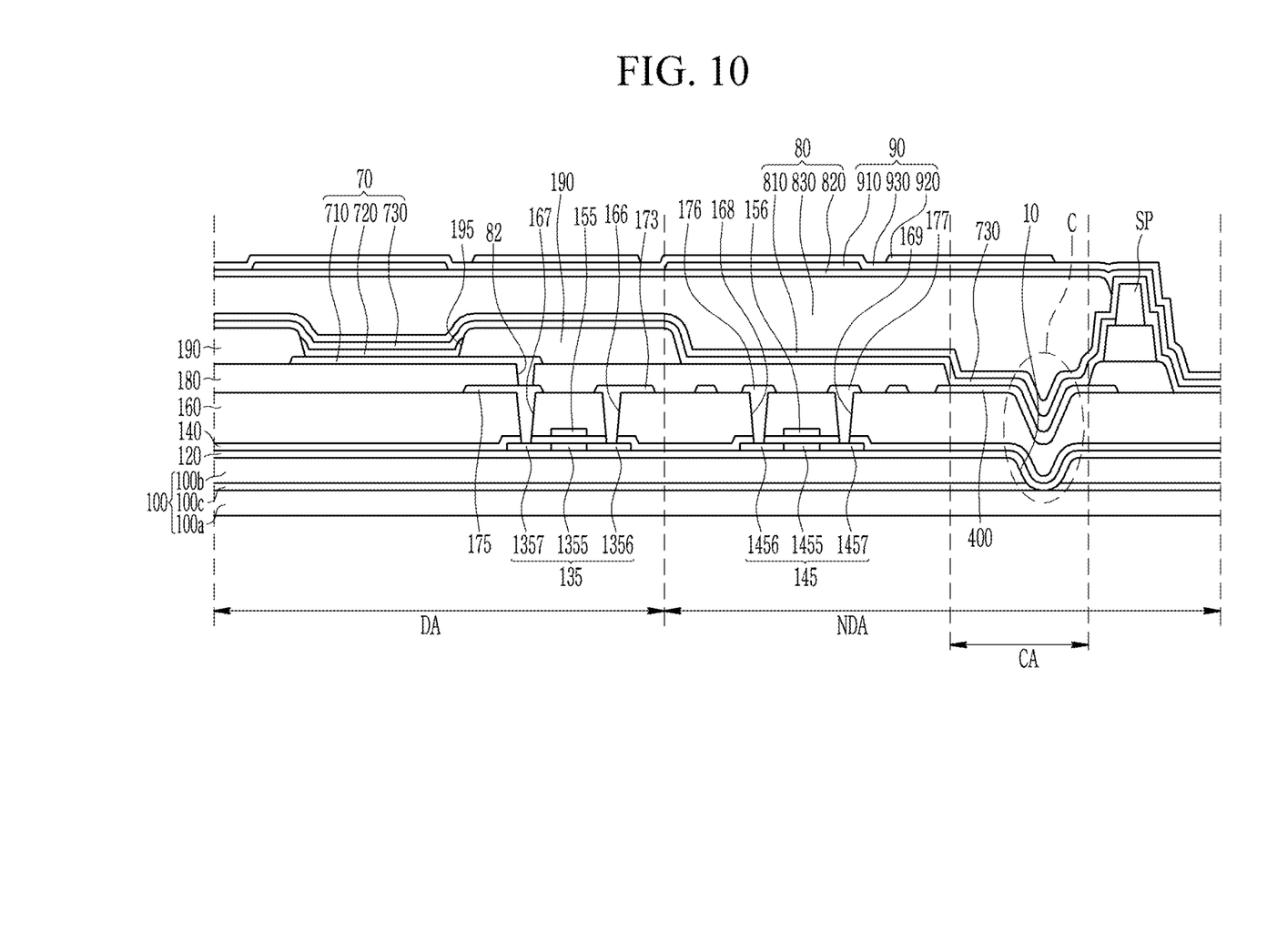
FIG. 10 is a schematic cross-sectional view of another exemplary embodiment of a display device according to the invention.

A display device according to another exemplary embodiment of the invention will be described with reference to FIG. 10. FIG. 10 is a schematic cross-sectional view of another exemplary embodiment of a display device according to the invention.

Referring to FIG. 10, the display device according to the exemplary embodiment shown in FIG. 10 is similar to the display device according to the exemplary embodiment shown in FIG. 2. The detailed description for the same constituent elements is omitted.

The display device according to the exemplary embodiment shown in FIG. 10 further includes a touch portion 90 disposed on the thin film encapsulation layer 80. The touch portion 90 includes a first touch electrode 910 and a second touch electrode 920, and a touch insulating layer 930 disposed between the first touch electrode 910 and the second touch electrode 920. An input to the display device, such as contact or a touch from an external element, may be applied to the touch portion 90.

The substrate 100 of the display device according to the present exemplary embodiment has the groove 10 disposed at the contact area CA, and the common voltage transmitting line 400 overlapping the groove 10 has the recess portion C disposed or formed along the groove 10. Accordingly, compared with the case that the common voltage transmitting line 400 does not have the recess portion C, an average interval between the first touch electrode 910 and the second touch electrode 920 disposed on the thin film encapsulation layer 80, and the common voltage transmitting line 400, is relatively larger. As the average interval between the first touch electrode 910 and the second touch electrode 920, and the common voltage transmitting line 400, increases, coupling that may be undesirably generated between the first touch electrode 910 and the second touch electrode 920, and the common voltage transmitting line 400, may be reduced or effectively prevented.

Features of the display devices according to the exemplary embodiment described with reference to FIG. 1 to FIG. 4, FIG. 5 and FIG. 6 are applicable to the display device according to the exemplary embodiment shown in FIG. 10.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
   a substrate including:
      a display area,
      a non-display area which is adjacent to the display area, and
      a groove in the substrate, in the non-display area thereof,
   a light emitting element disposed on the substrate in the display area thereof; and
   a common voltage transmitting line through which a common voltage is transmitted to the display area, disposed on the substrate in the non-display area thereof,
   wherein the common voltage transmitting line overlaps the groove in the substrate.

2. The display device of claim 1, wherein
   the light emitting element includes an electrode layer through which the common voltage is transmitted to the light emitting element, and
   the electrode layer of the light emitting element is in contact with the common voltage transmitting line at a position overlapping the groove.

3. The display device of claim 2, wherein
   the substrate further includes in each of the display area and non-display area thereof:
      a first insulating film, and
      a second insulating film disposed on the first insulating film, and
   the groove in the substrate extends only into the second insulating film.

4. The display device of claim 2, wherein
   the substrate further includes:
      a first insulating film in each of the display area and non-display area,
      a second insulating film disposed on the first insulating film, in each of the display area and non-display area, and
      a first barrier film disposed between the first insulating film and the second insulating film, and
   the groove in the substrate penetrates the second insulating film and extends into the first barrier film.

5. The display device of claim 2, wherein
   the substrate further includes in each of the display area and non-display area thereof:
      a first insulating film, and
      a second insulating film disposed on the first insulating film, and
   the groove in the substrate penetrates the second insulating film and extends into the first insulating film.

6. The display device of claim 2, further comprising plurality of grooves in the non-display area of the substrate,
   wherein in the non-display area of the substrate,
      the common voltage transmitting line overlaps each of the plurality of grooves in the substrate, and
      the electrode layer of the light emitting element is in contact with the common voltage transmitting line at each of positions respectively overlapping the plurality of grooves.

7. The display device of claim 1, wherein
   the substrate further includes in each of the display area and non-display area thereof:
      a first insulating film, and
      a second insulating film disposed on the first insulating film, and
   the groove in the substrate extends only into the second insulating film.

8. The display device of claim 1, wherein
   the substrate further includes:
      a first insulating film in each of the display area and non-display area,
      a second insulating film disposed on the first insulating film, in each of the display area and non-display area, and
      a first barrier film disposed between the first insulating film and the second insulating film, and
   the groove in the substrate penetrates the second insulating film and extends into the first barrier film.

9. The display device of claim 1, wherein
   the substrate further includes in each of the display area and non-display area thereof:
      a first insulating film, and
      a second insulating film disposed on the first insulating film, and
   the groove in the substrate penetrates the second insulating film and extends into the first insulating film.

10. The display device of claim 1, further comprising a plurality of grooves in the non-display area of the substrate,
    wherein in the non-display area of the substrate, the common voltage transmitting line overlaps each of the plurality of grooves in the substrate.

11. The display device of claim 1, wherein
    the light emitting element includes an electrode layer through which the common voltage is transmitted to the light emitting element,
    at the groove, the electrode layer of the light emitting element is in contact with the common voltage transmitting line,
    a planar area of the substrate at which the electrode layer of the light emitting element is in contact with the common voltage transmitting line defines a contact area of the substrate, and
    a total surface area of the electrode layer which is in contact with the common voltage transmitting line is larger than the contact area of the substrate.

12. The display device of claim 1, wherein
    the light emitting element includes an electrode layer through which the common voltage is transmitted to the light emitting element,
    the common voltage transmitting line extends into the groove defined in the substrate, in the non-display area thereof, and
    within the groove, the electrode layer of the light emitting element is in contact with the common voltage transmitting line.

13. A display device comprising:
a substrate including a groove;
a pixel at which an image is displayed; and
a common voltage transmitting line through which a common voltage is transmitted to the pixel, disposed on the substrate,
wherein
the common voltage transmitting line overlaps the groove in the substrate, and
the common voltage transmitting line is connected to the pixel at a position overlapping the groove.

14. The display device of claim 13, wherein
the substrate further includes:
a first insulating film, and
a second insulating film disposed on the first insulating film, and
the groove in the substrate extends only into the second insulating film.

15. The display device of claim 13, wherein
the substrate further includes:
a first insulating film,
a second insulating film disposed on the first insulating film, and
a first barrier film disposed between the first insulating film and the second insulating film, and
the groove penetrates the second insulating film and extends into the first barrier film.

16. The display device of claim 13, wherein
the substrate further includes:
a first insulating film, and
a second insulating film disposed on the first insulating film, and
the groove in the substrate penetrates the second insulating film and extends into the first insulating film.

17. The display device of claim 13, further comprising a plurality of grooves in the non-display area of the substrate,
wherein
the common voltage transmitting line overlaps each of the plurality of grooves in the substrate, and
the common voltage transmitting line is connected to the pixel at each of positions respectively overlapping the plurality of grooves.

18. The display device of claim 13, further comprising an insulating layer between the substrate and the common voltage transmitting line,
wherein
the insulating layer extends into the groove in the substrate to have a recessed portion of the insulating layer corresponding to the groove, and
the common voltage transmitting line extends into the recessed portion of the insulating layer, and
at the recessed portion of the insulating layer, the common voltage transmitting line is connected to the pixel.

* * * * *